United States Patent
Tran et al.

(10) Patent No.: US 8,354,864 B2
(45) Date of Patent: Jan. 15, 2013

(54) SENSE AMPLIFIER FOR LOW VOLTAGE HIGH SPEED SENSING

(75) Inventors: Hieu Van Tran, San Jose, CA (US); Sang Thanh Nguyen, Union City, CA (US); Hung Quoc Nguyen, Fremont, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 13/286,166

(22) Filed: Oct. 31, 2011

(65) Prior Publication Data

US 2012/0044774 A1    Feb. 23, 2012

Related U.S. Application Data

(60) Division of application No. 12/972,974, filed on Dec. 20, 2010, now Pat. No. 8,049,535, which is a continuation of application No. 12/493,240, filed on Jun. 28, 2009, now Pat. No. 7,855,583, which is a continuation of application No. 11/942,665, filed on Nov. 19, 2007, now Pat. No. 7,616,028, which is a continuation of application No. 10/838,999, filed on May 4, 2004, now Pat. No. 7,345,512.

(51) Int. Cl.
*G01R 19/00* (2006.01)
(52) U.S. Cl. .................. 327/52; 327/56; 327/89; 326/30
(58) Field of Classification Search .................. 327/52, 327/56, 89; 326/30
See application file for complete search history.

(56) References Cited

U.S. PATENT DOCUMENTS

| | | | |
|---|---|---|---|
| 3,748,476 | A | 7/1973 | Lippman et al. |
| 4,078,261 | A | 3/1978 | Millhollan et al. |
| 4,439,842 | A | 3/1984 | Malaviya |
| 5,237,533 | A | 8/1993 | Papaliolios |
| 5,289,411 | A | 2/1994 | Jeng et al. |
| 5,572,054 | A | 11/1996 | Wang et al. |
| 5,721,704 | A | 2/1998 | Morton |
| 5,943,263 | A | 8/1999 | Roohparvar |
| 5,973,966 | A | 10/1999 | Calligaro et al. |
| 6,016,276 | A * | 1/2000 | Fuji .......................... 365/189.07 |
| 6,208,575 | B1 | 3/2001 | Proebsting |
| 6,282,145 | B1 | 8/2001 | Tran et al. |
| 6,590,820 | B2 * | 7/2003 | Nakagawa ............... 365/189.07 |
| 6,801,466 | B2 * | 10/2004 | Giove et al. .................. 365/207 |
| 7,161,378 | B2 | 1/2007 | Kang et al. |
| 7,345,512 | B2 * | 3/2008 | Tran et al. ....................... 327/52 |
| 7,616,028 | B2 * | 11/2009 | Van Tran et al. ................ 327/52 |
| 7,855,583 | B2 * | 12/2010 | Tran et al. ....................... 327/52 |
| 8,049,535 | B2 * | 11/2011 | Van Tran et al. ................ 327/52 |
| 2008/0239834 | A1 | 10/2008 | Tran et al. |

* cited by examiner

*Primary Examiner* — Kenneth B. Wells
(74) *Attorney, Agent, or Firm* — DLA Piper LLP (US)

(57) ABSTRACT

A memory system includes a sense amplifier for detecting content of data memory cells by comparison with a voltage stored in a reference cell. The sense amplifier may comprise a comparator, first and second load circuits, and a low impedance circuit. A first input of the comparator is coupled to the low impedance circuit and a reference voltage node. A second input of the comparator is coupled to a data voltage node. The first load circuit loads a reference cell coupled to the reference voltage node. The second load circuit loads a data cell coupled to the data voltage node.

33 Claims, 9 Drawing Sheets

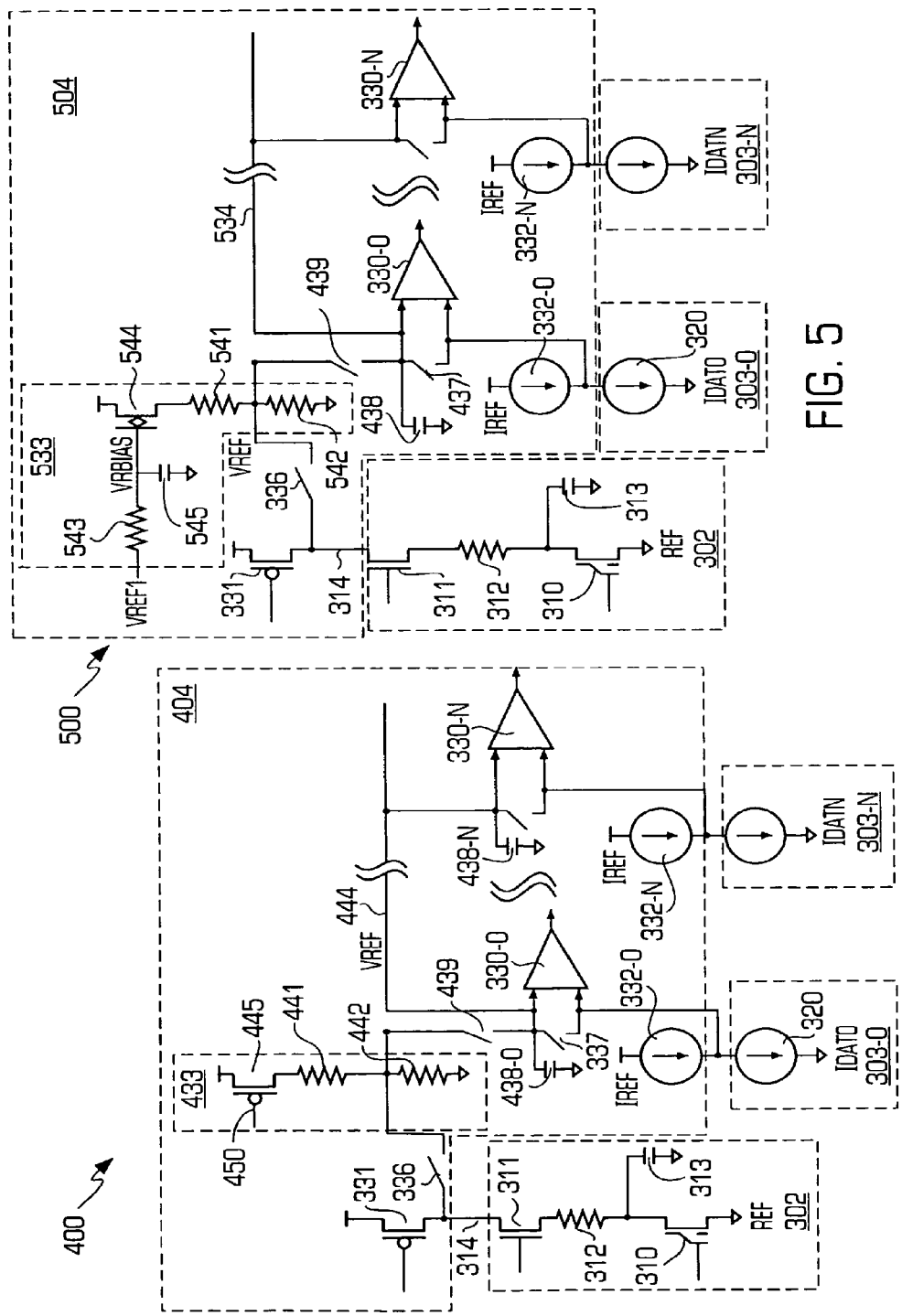

SENSE AMPLIFIER FOR LOW VOLTAGE HIGH SPEED SENSING

CROSS REFERENCE TO RELATED APPLICATION(S)

This is a divisional of application Ser. No. 12/972,974, filed Dec. 20, 2010, publication No. US 2011/0121863A1, now U.S. Pat. No. 8,049,535, which is a continuation of application Ser. No. 12/493,240, filed Jun. 28, 2009, publication No. US2010/0001765A1, now U.S. Pat. No. 7,855,583, which is a continuation of application Ser. No. 11/942,665, filed Nov. 19, 2007, publication No. US2008/0239834A1, now U.S. Pat. No. 7,616,028, which is a continuation of application Ser. No. 10/838,999, filed May 4, 2004, publication No. US2005/ 0249006A1, now U.S. Pat. No. 7,345,512, which are incorporated herein by reference in entirety.

BACKGROUND

The present invention relates to a sense amplifier, and more particularly to a sense amplifier for a multilevel cell memory.

Memory systems include sense amplifiers for detecting content stored in memory cells. In digital multilevel memories, reference cells store reference values for comparison with detected content in memory cells. The speed of and the loading on the sense amplifier impacts its performance.

SUMMARY

A sense amplifier comprises a comparator, first and second load circuits, and a low impedance circuit. The comparator includes a first input coupled to a reference node, includes a second input coupled to a data voltage node, and includes an output for providing a signal indicative of a difference in voltages on the reference and data voltage nodes. The first load circuit is coupled to the reference voltage node to load a reference cell. The second load circuit is coupled to the data voltage node to load a data cell. The low impedance circuit is coupled to the first input of the comparator.

BRIEF DESCRIPTION OF THE DRAWINGS

FIG. 4 is a schematic diagram illustrating a second embodiment of the memory subsystem of the memory system of FIG. 1.

FIG. 5 is a schematic diagram illustrating a third embodiment of a memory subsystem of the memory system of FIG. 1.

DETAILED DESCRIPTION

Figure 1:
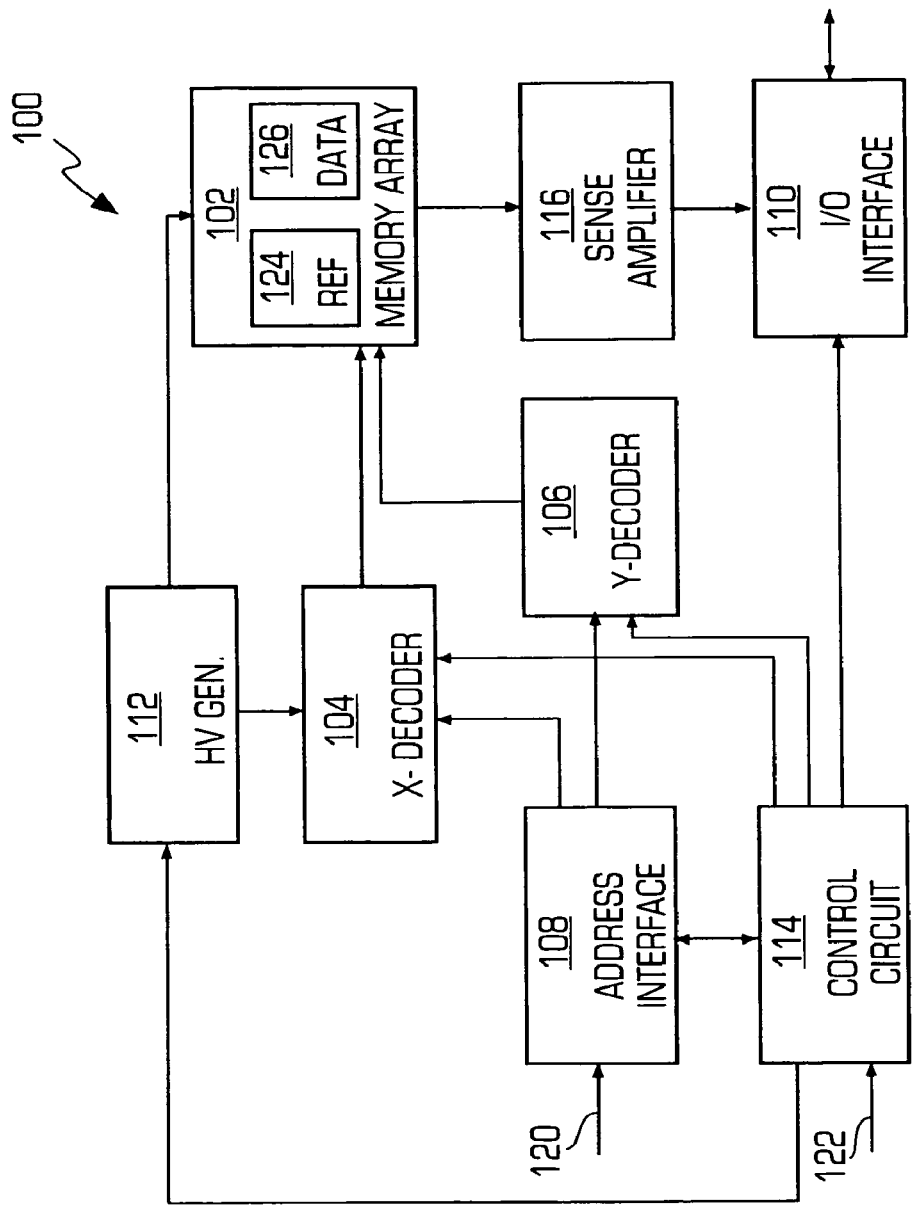
FIG. 1 is a block diagram illustrating a memory system.

FIG. 1 is a block diagram illustrating a memory system 100.

The memory system 100 comprises a memory array 102, an x-decoder 104, a y-decoder 106, an address interface 108, an input/output (I/O) interface 110, a high voltage generator 112, a control circuit 114, and a sense amplifier circuit 116.

The memory array 102 comprises an array 126 of data memory cells (not shown) arranged in rows and columns and an array 124 of reference memory cells (not shown). The memory array 102 may be, for example, a static random access memory, a dynamic random access memory, or a flash memory. The flash memory may include, for example, non-volatile floating gate memory cells. See, for example, U.S. Pat. No. 5,289,411, which is incorporated herein by reference. Non-volatile floating gate memory cells, arranged in an array of a plurality of rows and columns are well known in the art. One example of a type of non-volatile floating gate memory cell is a source side injection memory cell. See, for example, the memory cell disclosed in U.S. Pat. No. 5,572,054 which is incorporated herein by reference. In one embodiment, the memory cells are multilevel memory cells. An N-bit digital multilevel cell is defined as a memory cell capable of storing $2^N$ levels. The reference memory cell array 124 may be used as a reference system of reference voltage levels to verify the contents of the data memory cell array 126. In another embodiment, the data memory cell array 126 may include reference memory cells for storing the reference voltage levels.

Columns of cells of the reference memory array 124 and data memory array 126 are coupled to corresponding bitlines (not shown). Rows of memory cells of the data memory array 126 and cells of the reference memory array 124 are coupled to corresponding source lines (not shown) and corresponding word lines (not shown).

The address interface 108 comprises buffers and latches for address signals 120 and provides decoded row and column addresses to the x-decoder 104 and the y-decoder 106. The I/O interface 110 comprises buffers and data latches for communicating data with the memory array 102.

The high voltage generator 112 generates the high voltage signals for altering the contents of the memory cells of the memory array 102. The high voltage generator 112 provides a programming voltage signal to the memory array 102 to program selected memory cells, and provides an erase voltage signal to the memory array 102 to erase selected memory cells. The high voltage generator 112 receives control signals from the control circuit 114 for controlling the generation and application of the high voltage signals, the programming voltage signal and the erase voltage signal. The high voltage generator 112 may include a charge pump and high voltage regulators.

The control circuit 114 provides control signals to the x-decoder 104, the y-decoder 106, the address interface 108, the input/output (I/O) interface 110, and the high voltage generator 112 for controlling the memory system 100. The control circuit 114 controls alteration of the contents of the memory array 102 through writing and erasing of the memory cells and controls reading of the memory array 102 in response to the address signals 120 and control signals 122.

The sense amplifier circuit 116 includes sense amplifiers, such as the sensing circuits described below in conjunction with FIGS. 2-10, for detecting contents stored in the memory cells of the memory array 102.

In one embodiment, the memory array 102 includes a source side injection flash technology, which uses lower power in hot electron programming, and efficient injector based Fowler-Nordheim tunneling erasure. The programming may be done by applying a high voltage on the source of the memory cell, a bias voltage on the control gate of the memory cell, and a bias current on the drain of the memory cell. The programming in effect places electrons on the floating gate of memory cell. The erase is done by applying a high voltage on the control gate of the memory cell and a low voltage on the source and/or drain of the memory cell. The erase in effect removes electrons from the floating gate of memory cell. The verify (sensing or reading) is done by placing the memory cell in a voltage mode sensing, e.g., a bias voltage on the source, a bias voltage on the gate, a bias current coupled from the drain (bitline) to a low bias voltage such as ground, and the voltage on the drain is the readout cell voltage VCELL. The bias current may be independent of the data stored in the memory cell. In another embodiment, the verify (sensing or reading) is done by placing the memory cell in a current mode sensing, e.g., a low voltage on the source, a bias voltage on the gate, a load (resistor or transistor) coupled to the drain (bitline) from a high voltage supply, and the voltage on the load is the readout voltage. In one embodiment, the array architecture and operating methods may be the ones disclosed in U.S. Pat. No. 6,282,145, entitled "Array Architecture and Operating Methods for Digital Multilevel Nonvolatile Memory Integrated Circuit System" by Tran et al., the subject matter of which is incorporated herein by reference.

Figures 2, 3:
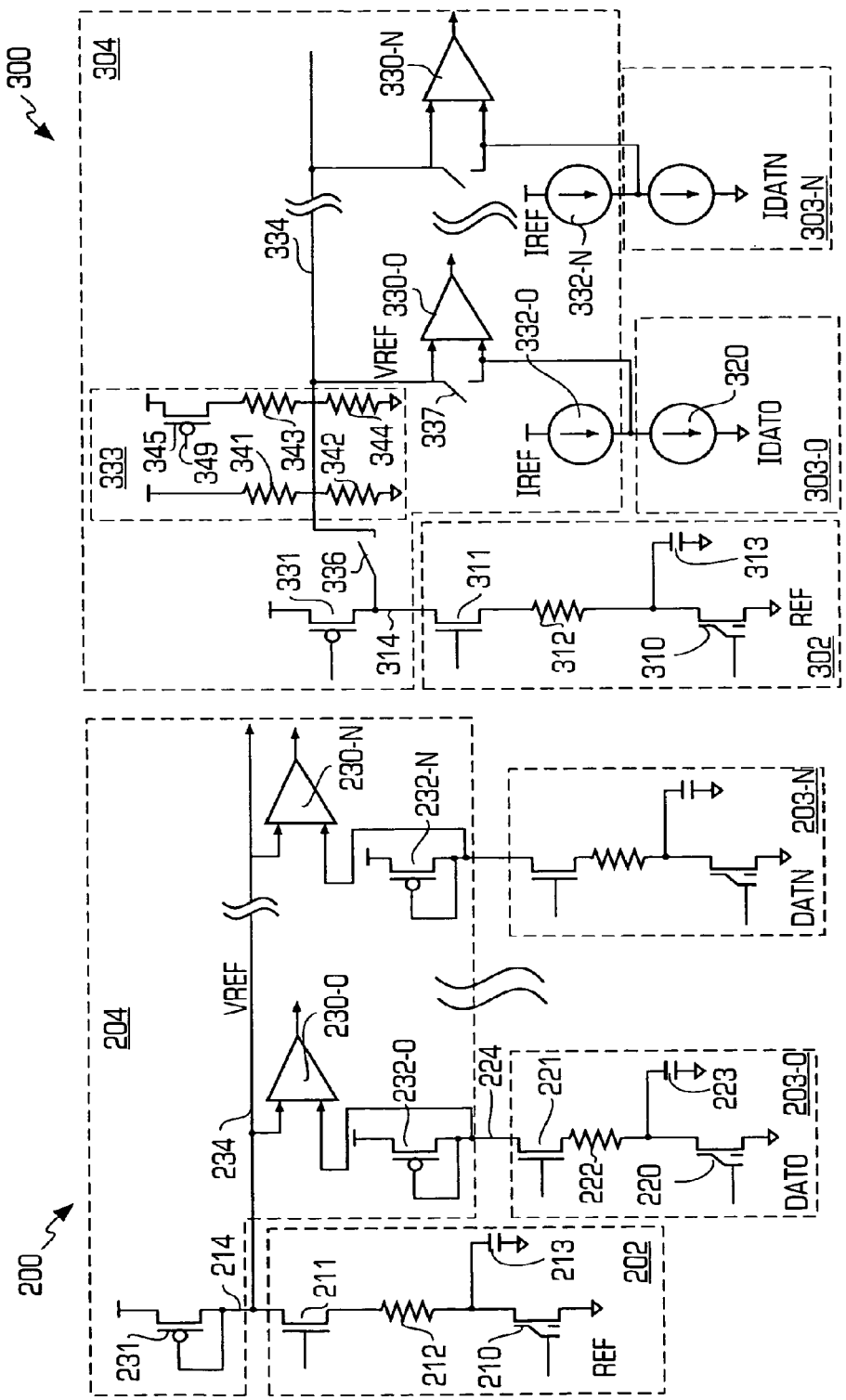
FIG. 2 is a schematic diagram illustrating a conventional memory subsystem.
FIG. 3 is a schematic diagram illustrating a first embodiment of a memory subsystem of the memory system of FIG. 1.

FIG. 2 is a schematic diagram illustrating a conventional memory subsystem 200.

The conventional memory subsystem 200 may be a portion of the memory system 100 and comprises a reference column 202, a plurality of data columns 203-0 through 203-N, and a sensing circuit 204, which may be a part of the reference array 124, the data array 126, and the sense amplifiers 116, respectively, of the memory system 100 (FIG. 1). The reference column 202 comprises a plurality of reference memory cells 210 (only one shown for clarity), and a bitline switch transistor 211 coupled to a reference bitline 214. (Only data column 203-0 shows reference numbers for clarity.) A bitline resistor 212 and a bitline capacitor 213 are shown as discrete elements to indicate the respective resistance and capacitance on the reference bitline 214.

The data column 203 comprises a plurality of data memory cells 220 (only one shown for clarity), and a bitline switch transistor 221 coupled to a data bitline 224. A bitline resistor 222 and a bitline capacitor 223 are shown as discrete elements to indicate the respective resistance and capacitance on the data bitline 224.

The sensing circuit 204 comprises a plurality of comparators 230-0 through 230-N, a PMOS transistor load 231, and a plurality of PMOS transistor loads 232-0 through 232-N. The diode connected PMOS transistor load 231 is coupled to the reference bitline 214 to provide a load to the reference memory cells 210, and is coupled to a reference voltage line 234, which is coupled to the comparators 230-0 through 230-N. The diode connected PMOS transistor loads 232-0 through 232-N are coupled to a data bitline 224 of a respective data column 203-0 through 203-N to provide a load to the data memory cells 220 and is coupled to an input of the respective comparator 230-0 through 230-N. The PMOS transistor load 231 may be sized approximately to a reference level on the voltage reference line 234 for comparing with the data voltage level. In an illustrative embodiment, the size ratio of the reference PMOS transistor load 231 to the data PMOS transistor load 232 is 0.5. The comparator 230 provides an output indicative of the data stored in a selected data memory cell 220 relative to the reference voltage.

The conventional memory subsystem 200 has several disadvantages. The speed of the sensing circuit 204 is partially determined by the settling of the reference voltage and the data cell voltage. The settling of the reference voltage on the reference voltage line 234 is determined by the PMOS transistor load 231, the bitline resistance 212, the bitline capacitance 213 on the reference bitline 214, and loading from the voltage reference line 234 and the comparators 232, which is typically large due to the long line coupling for any comparators. The settling of the data voltage is determined by the settling of the PMOS transistor load 232, the bitline resistance 222 and the bitline capacitance 223 on the data bitline 224. The cell reference voltage from the reference memory cell 210 applied to the reference bitline 214 and the reference voltage line 234 drives a large load of the voltage reference line 234 and the comparators 230. Further, the bias on the bitlines 214 and 224 is low due to voltage drop from the diode connected PMOS transistor loads 231 and 232, respectively.

In the conventional memory subsystem 200, the voltage overhead of the supply voltage may be high. In an illustrative example, the supply voltage VCC is greater than 1.6 volts, and the voltage drop across the diode connected PMOS transistor load 231, the bitline switch transistor 211, and the reference memory cell 210 are 1.0 volts, 0.1 volts, and 0.5 volts, respectively. Because the voltage on the reference voltage line 234 is nominally 0.6 volts, the voltage swing of the reference voltage is limited.

The memory subsystems of FIGS. 3-10 may be a portion of the memory system 100 and may include part of the reference array 124, the data array 126, and the sense amplifiers 116, respectively, of the memory system 100 (FIG. 1).

FIG. 3 is a schematic diagram illustrating a memory subsystem 300.

The memory subsystem 300 comprises a reference column 302, a plurality of data columns 303-0 through 303-N, and a sensing circuit 304. The reference column 302 comprises a plurality of reference memory cells 310 (only one shown for clarity), and a bitline switch transistor 311 coupled to a reference bitline 314. A bitline resistor 312 and a bitline capacitor 313 are shown as discrete elements to indicate the respective resistance and capacitance on the reference bitline 314. The reference column 302 may be coupled to N columns of data columns 303. The number N may be one or more. For example, the number N may be selected so that one reference column 302 is coupled to one byte of data in a row or a page of data. In another embodiment, the data column 302 and the reference array 124 (FIG. 1) may be disposed in the sense amplifier 116 for high speed as a global reference cell. The data column 303 comprises a data current source 320 that provides a data current indicative of the data stored in a data memory cell.

The sensing circuit 304 comprises a plurality of comparators 330-0 through 330-N, a PMOS transistor 331, a plurality of reference current sources 332-0 through 332-N, an impedance circuit 333, and a plurality of switches 336 and 337. The PMOS transistor 331 provides a load on the bitline 314 of the reference column 302. Each reference current source 332 provides a reference current to a common node formed of the data current source 320 and a second input of a corresponding comparator 330. The switch 336 couples the reference bitline 314 to a voltage reference line 334, which is coupled to a first input of the comparators 330 and to the switch 337, and selectively provides the detected reference voltage on the reference bitline 314 to the comparators 330 for comparison with the detected voltage from the data cells in a corresponding data column 303. The switch 337 is coupled between the first and second inputs of the corresponding comparator 330 for equalization. Before reading the data cell, the switch 337 is closed so that both inputs of the comparator 330 are set to an equal voltage. During reading of the cells, the switch 337 is open and the switch 336 is closed.

The impedance circuit 333 comprises a plurality of resistors 341 and 342 arranged as a voltage divider to apply a voltage to the voltage reference line 334, which is coupled to an input of the comparators 330 and to the switches 336 and 337. The impedance circuit 333 further comprises a plurality of resistors 343 and 344 and a switch 345 arranged as a voltage divider to selectively apply a voltage to the voltage reference line 334 in response to an enable signal 349. The switch 345 controls the voltage divider of the resistors 343 and 344 on the reference voltage line 334 to enable a low impedance for a short period of sensing. The switch 345 is disabled so that the impedance circuit 333 provides a high impedance because of the voltage divider of the resistors 341 and 342. In one embodiment, the switch 345 is a PMOS transistor. In one embodiment, the low impedance is approximately 1 kilohm and the higher impedance is in the range of 5-10 kilohms.

In the memory subsystem 300, the voltage overhead of the supply voltage may be lower than that of the conventional memory system 200 (FIG. 2). In an illustrative example, the supply voltage VCC is greater than 1.6 volts, and the voltage drop across the PMOS transistor 331, the bitline switch transistor 311, and the reference memory cell 310 are 0.3 volts, 0.1 volts, and 1.2 volts, respectively. Because the reference voltage line 334 is nominally 1.3 volts, the higher voltage provides a wider voltage swing for the sensing voltage. Because the voltage across the memory cell may be higher, the cell current may be higher.

The memory subsystem 300 provides a low impedance path for settling of the reference voltage and data voltage, a high voltage swing, and a high cell current. Further, the bias on the reference bitline 314 may be high. The speed of the memory subsystem 300 may be determined by settling of the resistor 312 and the capacitor 313 on the reference bitline 314. A very low impedance reference voltage may drive a large load of the reference voltage line 334 and the comparators 330. The low impedance may be traded off against power consumption for faster settling time.

FIG. 4 is a schematic diagram illustrating a memory subsystem 400.

The memory subsystem 400 comprises a reference column 302, a plurality of data columns 303-0 through 303-N, and a sensing circuit 404. The sensing circuit 404 is similar to the sensing circuit 304 (FIG. 3), but includes an impedance circuit 433 instead of an impedance circuit 333. The impedance circuit 433 comprises a plurality of resistors 441 and 442 and a switch 445 arranged as a voltage divider to selectively apply a voltage to the voltage reference line 444 in response to an enable signal 450. The switch 445 controls the voltage divider of the resistors 441 and 442 on the reference voltage line 444 to disable a low impedance during comparison. In an alternative embodiment, the sensing circuit 404 includes an impedance circuit 333 instead of the impedance circuit 433. The sensing circuit 404 further comprises a plurality of reference holding capacitors 438-0 through 438-N and a switch 439. The reference holding capacitor 438 is coupled to an input of a corresponding comparator 330 and to the reference voltage line 444. The reference holding capacitor 438 holds the reference voltage level (functioning as a dynamic voltage) on the input to the comparator 330 during sensing. This may allow the reference voltage to be less susceptible to power supply fluctuations. This also may allow the sensing circuit 404 to include alternative embodiments of the impedance circuits 333 or 433 that can be disabled during comparison to save power. The switch 439 couples the impedance circuit 433 to the input of the comparator 330 and the reference holding capacitor 438, such that this input (i.e., line 444) is a floating voltage node. In an alternative embodiment, the memory subsystem 400 does not include a reference holding capacitor 438 coupled to each of the comparators 330, but may include a number of reference holding capacitors 438 less than the number of comparators 330.

FIG. 5 is a schematic diagram illustrating a memory subsystem 500.

The memory subsystem 500 comprises a reference column 302, a plurality of data columns 303-0 through 303-N, and a sensing circuit 504. The sensing circuit 504 is similar to the sensing circuit 404 (FIG. 4), but includes an impedance circuit 533 instead of an impedance circuit 433. The impedance circuit 533 comprises a plurality of resistors 541, 542 and 543, a NMOS transistor 544, and a capacitor 545. The resistors 541 and 542 are arranged as a voltage divider to apply a voltage to the reference voltage line 534. In one embodiment, the NMOS transistor 544 is a native transistor having a gate threshold approximately in the range of −0.1 to 0.3 volts. The NMOS transistor 544 may isolate the noise on the supply voltage from the voltage reference line 534. A filter formed of the resistor 543 and the capacitor 545 filters a reference voltage VREF1 to generate a filtered bias voltage for the gate of the NMOS transistor 544. The reference voltage VREF1 may be, for example, the supply voltage VDD or a reference voltage from a reference bandgap generator.

Figure 6:
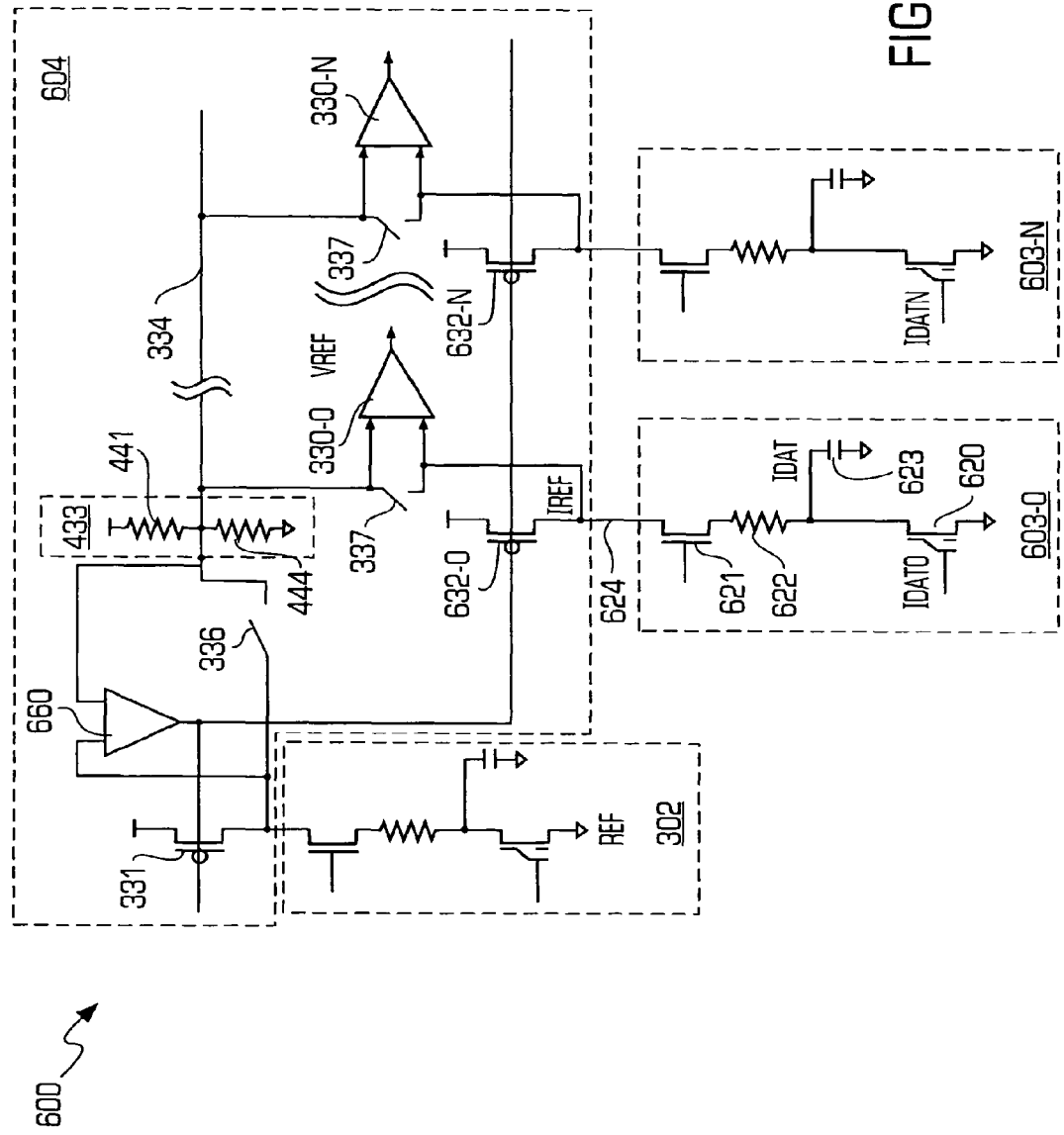
FIG. 6 is a schematic diagram illustrating a fourth embodiment of a memory subsystem of the memory system of FIG. 1.

FIG. 6 is a schematic diagram illustrating a memory subsystem 600.

The memory subsystem 600 comprises a reference column 302, a plurality of data columns 603-0 through 603-N, and a sensing circuit 604. The data column 603 comprises a plurality of data memory cells 620 (only one shown for clarity), and a bitline switch transistor 621 coupled to a data bitline 624. A bitline resistor 622 and a bitline capacitor 623 are shown as discrete elements to indicate the respective resistance and capacitance on the data bitline 624. The sensing circuit 604 is similar to the sensing circuit 304 (FIG. 3), and further comprises an operational amplifier 660, but also comprises a plurality of PMOS transistors 632-0 through 632-N instead of a corresponding reference current source 332. The operational amplifier 660 provides a loop control to provide bias for the PMOS transistors 331 and 632. The inputs of the operational amplifier 660 are coupled to the reference bitline 314 and the reference voltage line 334, and the output of the operational amplifier 660 biases the transistors 331 and 632. During an initial stage, the switch 337 is closed and the operational amplifier biases the transistors 331 and 632 so that voltage is on the reference bitline 314 and the reference voltage line 334 are equal. During sensing, the switch 336 is closed and the comparator 330 detects the content of the data memory cell 620.

Figure 7:
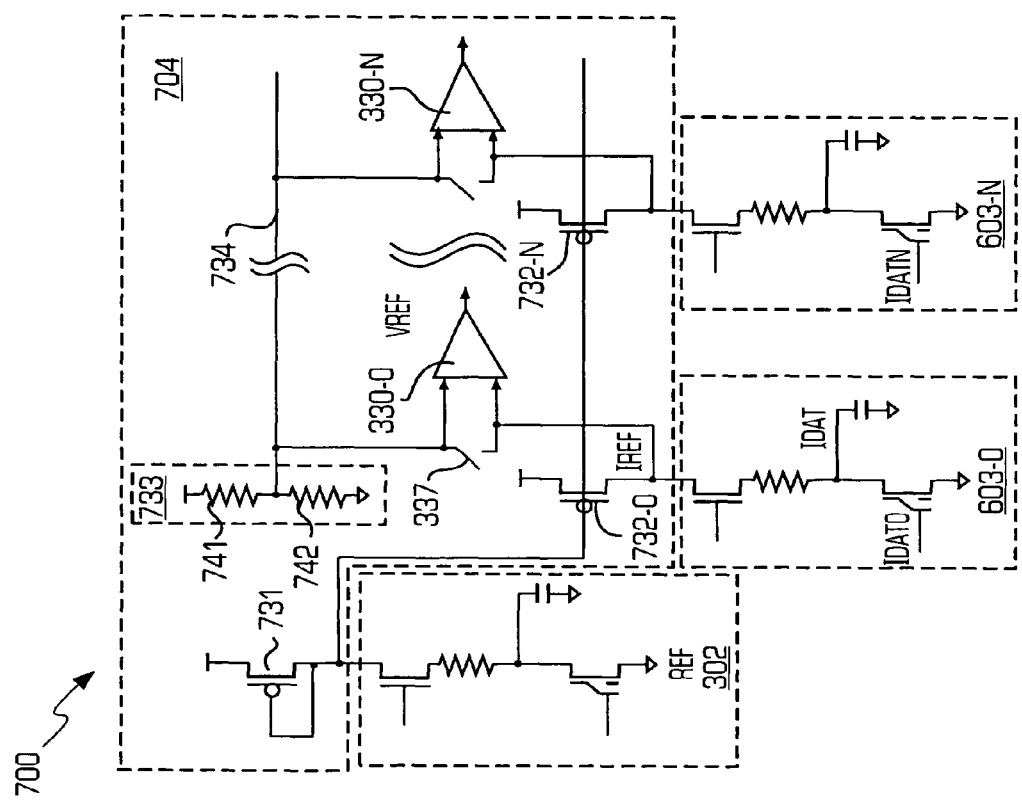
FIG. 7 is a schematic diagram illustrating a fifth embodiment of a memory subsystem of the memory system of FIG. 1.

FIG. 7 is a schematic diagram illustrating a memory subsystem 700.

The memory subsystem 700 comprises a reference column 302, a plurality of data columns 603-0 through 603-N, and a sensing circuit 704. The sensing circuit 704 comprises a plurality of comparators 330-0 through 330-N, a plurality of switches 337, a diode connected PMOS transistor 731, a plurality of PMOS transistor 732-0 through 732-N, and an impedance circuit 733. The diode connected transistor 731 provides the load for the reference column 302 and functions as a current mirror to the transistors 732 that are a load for the data columns 603. The impedance circuit 733 comprises a plurality of resistors 741 and 742 arranged as a voltage divider to apply a voltage to a voltage reference line 734, which is coupled to an input of the comparators 330. The resistors 741 and 742 may be variable resistors. The reference cells of the reference column 302 may be multiple cells (e.g., M number of cells) and the load PMOS transistor 731 may be varied (e.g., by a multiplier M), and the resistors 741 and 742 may be trimmed by a fuse to compensate for channel length modulation offset and for margin checking.

Figure 8:
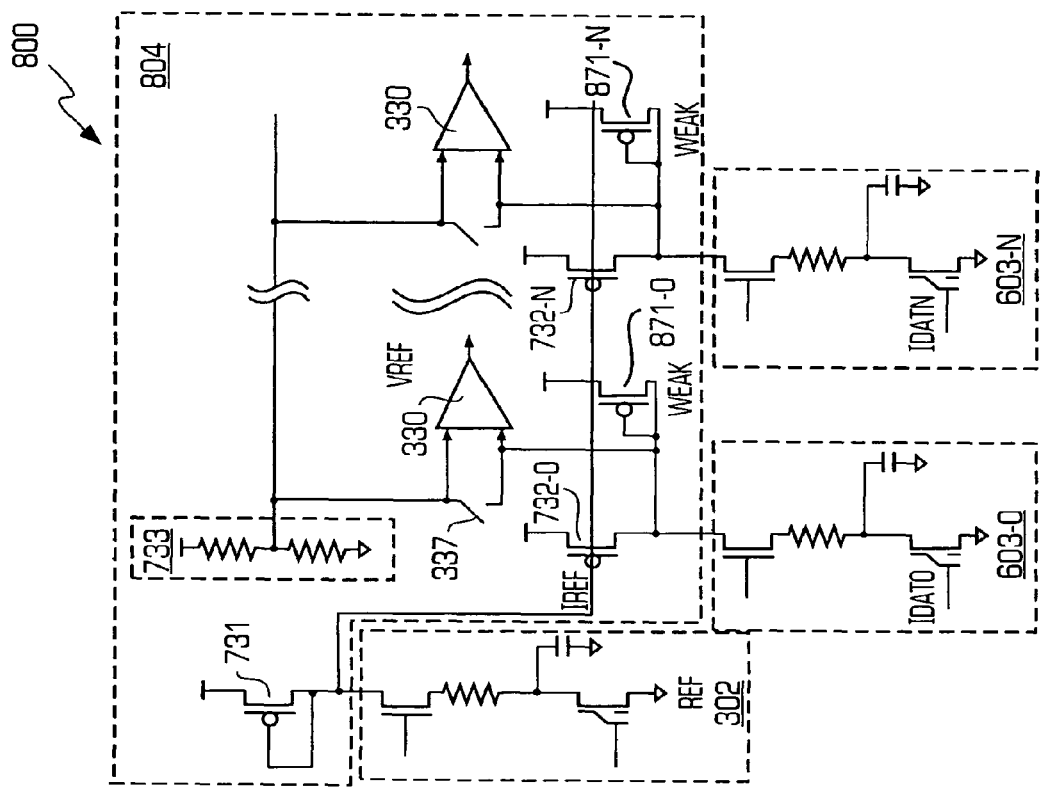
FIG. 8 is a schematic diagram illustrating a sixth embodiment of a memory subsystem of the memory system of FIG. 1.

FIG. 8 is a schematic diagram illustrating a memory subsystem 800.

The memory subsystem 800 comprises a reference column 302, a plurality of data column 603-0 through 603-N, and a sensing circuit 804. The sensing circuit 804 is similar to the sensing circuit 704 (FIG. 7), and further comprises a plurality of diode connected PMOS transistors 871-0 through 871-N. The diode connected PMOS transistors 871 are coupled to a corresponding drain of PMOS transistor 732. The PMOS transistor 871 is selected to be a weak diode coupled in parallel with the current mirror PMOS transistor 732 to provide a small load on the data column 603. In another embodiment, the transistors 871-0 through 871-N may be similar in size to the transistor 731 to settle the data bitlines more quickly. In this embodiment, a multiplexer may be included to disconnect the transistors 871 after bitline settling and then begin the comparison.

Figure 9:
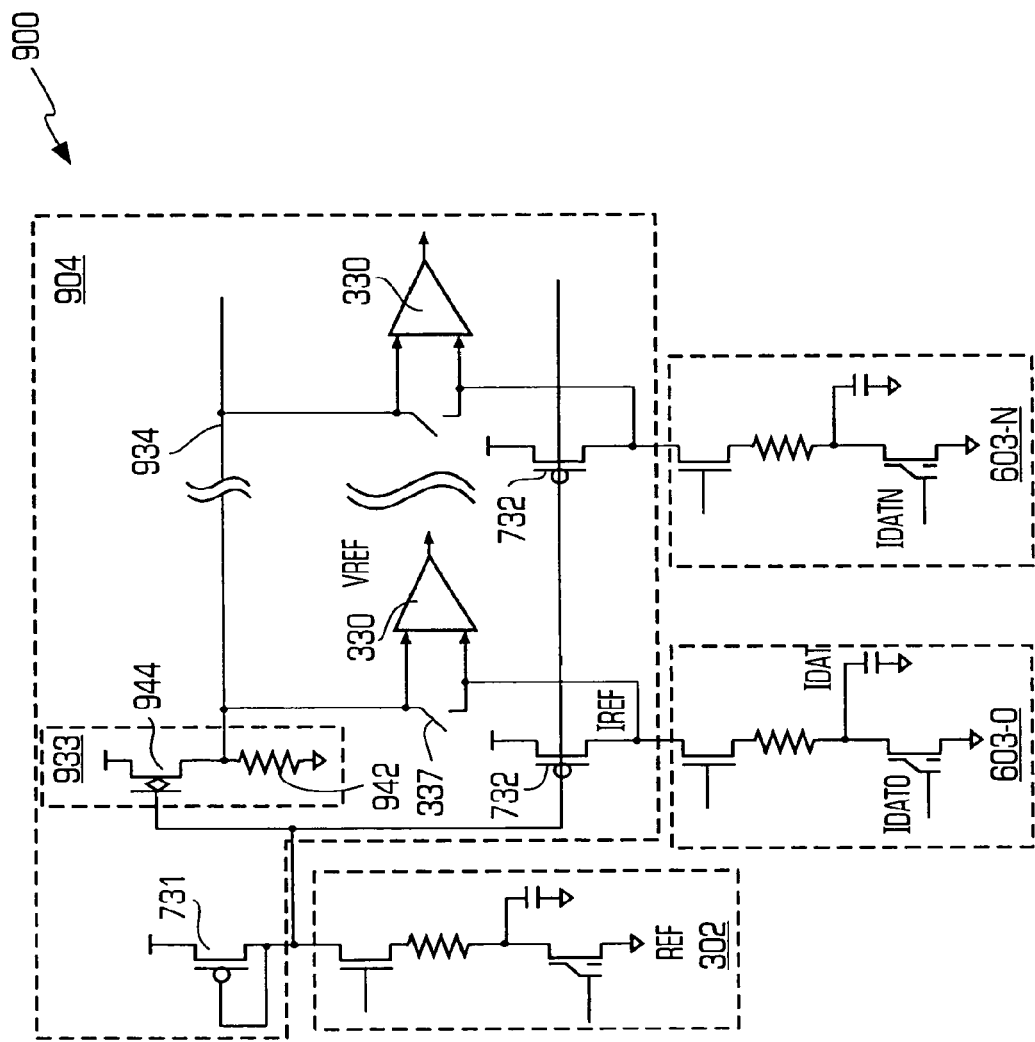
FIG. 9 is a schematic diagram illustrating a seventh embodiment of a memory subsystem of the memory system of FIG. 1.

FIG. 9 is a schematic diagram illustrating a memory subsystem 900.

The memory subsystem 900 comprises a reference column 302, a plurality of data columns 603-0 through 603-N, and a sensing circuit 904. The sensing circuit 904 is similar to the sensing circuit 704 (FIG. 7), but includes an impedance circuit 933 instead of the impedance circuit 733. The impedance circuit 933 comprises a resistor 942 and an NMOS transistor 944 coupled in series between the supply voltage and ground to form a divider on a voltage reference line 944, which is coupled to the comparators 330. The gate of the NMOS transistor 944 is biased by the drain of the diode connected PMOS transistor 731. The impedance circuit 933 provides a low impedance path.

Figure 10:
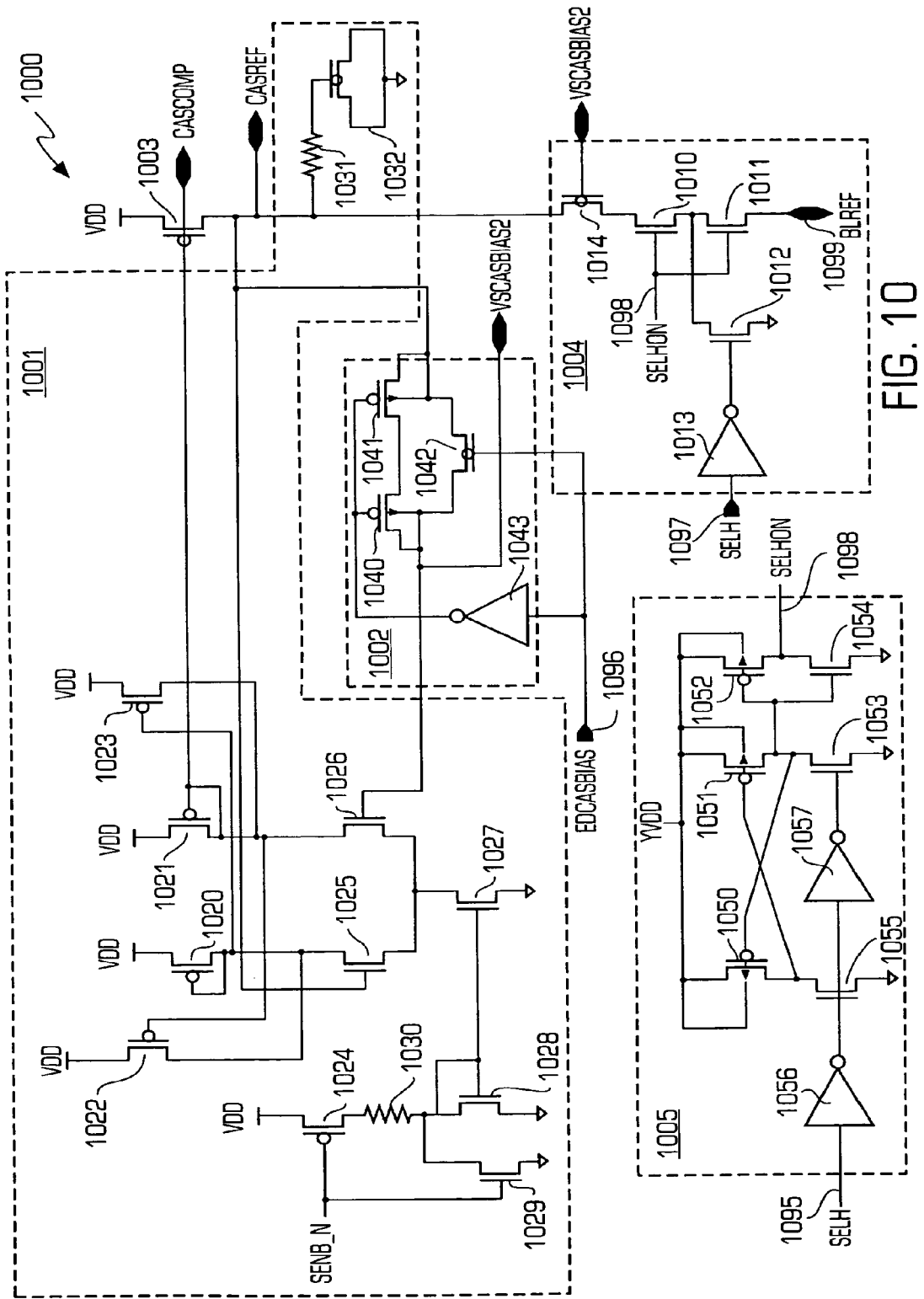
FIG. 10 is a schematic diagram illustrating an eighth embodiment of a memory subsystem of the memory system of FIG. 1.

FIG. 10 is a schematic diagram illustrating a memory subsystem 1000.

The memory subsystem 1000 may be one embodiment of the memory subsystem 600 (FIG. 6). The memory subsystem 1000 comprises a comparator 1001, a switch 1002, a load PMOS transistor 1003, a reference selection switch 1004, and a level shifter 1005. The load PMOS transistor 1003 functions in a similar manner as the load transistor 331. The reference selection switch 1004 functions in a similar manner as the bitline switch transistor 311, and comprises a plurality of NMOS transistors 1010, 1011, and 1112, a native NMOS transistor 1114 and an inverter 1013. The NMOS transistors 1010 and 1011 and the native NMOS transistor 1014 are coupled in series between the drain of the load PMOS transistor 1003 and a reference bitline 1099. The NMOS transistors 1010 and 1011 are enabled by a selection signal 1098 from the level shifter 1005. The NMOS transistor 1012 grounds the node formed of the source of the NMOS transistor 1010 and the drain of the NMOS transistor 1011 to precharge the bitline to ground in response to a selection signal 1097 that is inverted by the inverter 1013.

The comparator 1001 comprises a plurality of PMOS transistors 1020 through 1024, a plurality of NMOS transistors 1025 through 1029, a plurality of resistors 1030 and 1031, and a capacitor 1032. The PMOS transistors 1020 and 1021 and the NMOS transistors 1025, 1026, and 1027 are arranged as a differential amplifier with input terminals on the gates of the NMOS transistors 1025 and 1026. The PMOS transistors 1022 and 1023 provide pull up for the output node of the comparator 1001 to increase the response time. The PMOS transistor 1024, the NMOS transistors 1028 and 1029, and the resistor 1030 provide and enable a bias that is applied to the gate of the NMOS transistor 1027 to control the differential amplifier. The resistor 1031 and the capacitor 1032 form a compensation filter on the input coupled to the gate of the NMOS transistor 1025.

The switch 1002 provides equalization on the inputs of the comparator 1001 by selectively shorting the inputs in response to an equalization signal. The switch 1002 comprises a plurality of PMOS transistors 1040 and 1041, an NMOS transistor 1042 and an inverter 1043.

The level shifter 1005 comprises a plurality of PMOS transistors 1050, 1051, and 1052, a plurality of NMOS transistors 1053, 1054 and 1055, and a plurality of inverters 1056 and 1057. The level shifter 1005 provides the selection signal 1098 in response to a selection signal 1095 applied to the inverter 1056 that enables the transistors 1053 and 1055.

Figure 11:
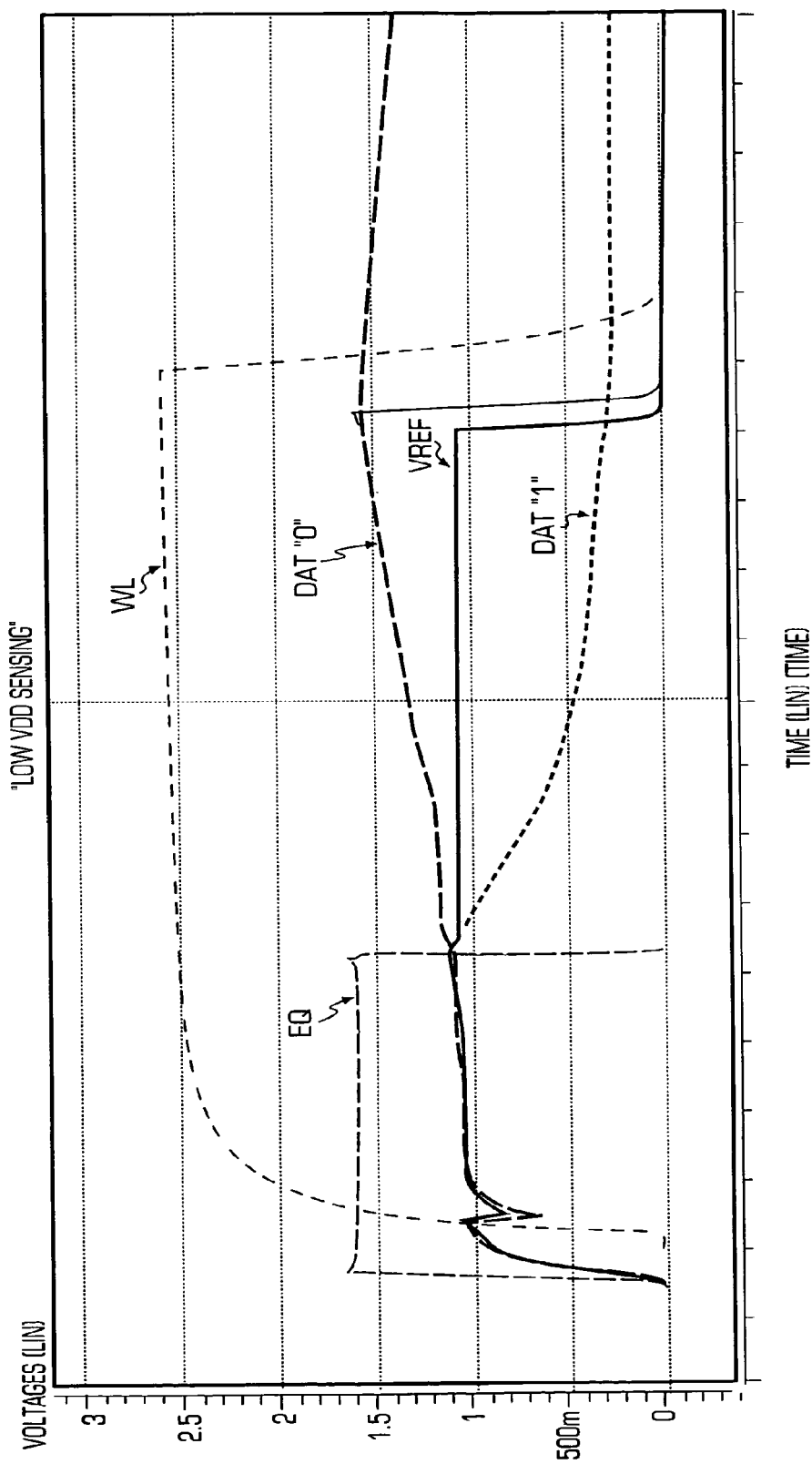
FIG. 11 is a graph illustrating the timing of control signals and data of the memory subsystem of FIG. 10.

FIG. 11 is a graph illustrating the timing of control signals and data of the memory subsystem 1000. The signals shown in FIG. 11 are of an illustrative embodiment of the memory subsystem 1000. The equalization (EQ) signal is used to equalize the voltages across comparators and to equalize reference and data voltages. The voltage on the word line (WL) is shown for selecting a memory cell. The reference voltage (VREF) is the voltage from the reference memory cell. Two different data levels (DATA0 and DATA1) are shown to indicate the detected data.

The sensing circuits described in conjunction with FIGS. 3-10 may provide low voltage high speed sensing. The sensing circuit may be faster because of fast equalization by a low impedance circuit. A differential comparator may be fast due to equalization by another low impedance circuit. The sensing circuit may allow biasing of the bitline at a higher voltage to maximize cell current without sacrificing the speed of the readout.

In the foregoing description, various methods and apparatus, and specific embodiments are described. However, it should be obvious to one conversant in the art, various alternatives, modifications, and changes may be possible without departing from the spirit and the scope of the invention which is defined by the metes and bounds of the appended claims.

What is claimed is:

1. A sense amplifier comprising
   a comparator including a first input coupled to a reference voltage node, a second input coupled to a data voltage node, and an output providing a signal indicative of a difference in voltages on the reference and data voltage nodes;
   a first load circuit coupled to the reference voltage node to load a reference cell;
   a second load circuit coupled to the data voltage node to load a data cell;
   an impedance circuit coupled to the first input, the impedance circuit comprising:
      a switch coupled to a supply voltage node; and
      a voltage divider coupled between the switch and ground, the voltage divider including:

a first resistor including a first terminal coupled to the switch and including a second terminal coupled to the first input of the comparator; and a second resistor including a first terminal coupled to the second terminal of the first resistor and including a second terminal coupled to a ground node; and wherein the switch, when disabled, sets the impedance circuit at an impedance established by the voltage divider that is a higher impedance relative to an impedance of the impedance circuit when the switch is enabled.

2. The sense amplifier of claim 1 wherein the first load circuit includes a PMOS transistor including a source terminal coupled to a supply voltage terminal, including a drain coupled to the reference voltage node, and including a gate coupled to a control signal node, wherein the second load circuit comprises a reference current source.

3. The sense amplifier of claim 2 further comprising a first switch coupled between the first and second inputs of the comparator to selectively couple said first and second inputs.

4. The sense amplifier of claim 1 wherein the first load circuit is disposed adjacent said reference cell, the second load circuit is disposed adjacent said data cell.

5. The sense amplifier of claim 4 wherein the reference cell is disposed outside of an array that includes the data cell.

6. The sense amplifier of claim 1 wherein the switch comprises:

a MOS transistor including first and second terminals spaced apart with a channel therebetween and including a gate for controlling current in said channel, said first terminal being coupled to a supply voltage node, said second terminal being coupled to the first terminal of the second resistor, said gate being coupled to a reference supply voltage node.

7. The sense amplifier of claim 6 wherein the impedance circuit further comprises a filter coupled between the reference supply voltage node and the gate of the MOS transistor.

8. The sense amplifier of claim 1 further comprising a control circuit coupled to the first and second load circuits to control the loading on the reference voltage node and the data reference nodes, respectively, in response to voltages on the reference and data voltage nodes.

9. The sense amplifier of claim 1 wherein the impedance circuit comprises a resistor divider composed of a third resistor and a fourth resistor.

10. The sense amplifier of claim 1 further comprising a first switch coupled between the first and second inputs of the comparator to selectively couple said first and second inputs.

11. A sense amplifier comprising:

a comparator including a first input coupled to a reference voltage node, a second input coupled to a data voltage node, and an output providing a signal indicative of a difference in voltages on the reference and data voltage nodes;

a first load circuit coupled to the reference voltage node to load a reference cell;

a second load circuit coupled to the data voltage node to load a data cell;

an impedance circuit coupled to the first input, the impedance circuit comprising:

a switch coupled to a supply voltage node;

a first resistor including a first terminal coupled to the switch and including a second terminal coupled to the first input of the comparator;

a second resistor including a first terminal coupled to the second terminal of the first resistor and including a second terminal coupled to a ground node, wherein together the switch, the first resistor and the second resistor form a first voltage divider; and a second voltage divider coupled between the switch and ground and having a node connected to the first terminal of the second resistor;

wherein the switch, when disabled, sets the impedance circuit at an impedance established by the second voltage divider that is a higher impedance relative to an impedance of the impedance circuit when the switch is enabled.

12. The sense amplifier of claim 11 further comprising a second switch coupled between the first and second inputs of the comparator to selectively couple said first and second inputs.

13. The sense amplifier of claim 11 wherein the first load circuit includes a PMOS transistor including a source terminal coupled to a supply voltage terminal, including a drain coupled to the reference voltage node, and including a gate coupled to a control signal node, and wherein the second load circuit comprises a reference current source.

14. The sense amplifier of claim 13 further comprising a second switch coupled between the first and second inputs of the comparator to selectively couple said first and second inputs.

15. The sense amplifier of claim 11 wherein the first load circuit is disposed adjacent said reference cell, the second load circuit is disposed adjacent said data cell.

16. The sense amplifier of claim 15 wherein the reference cell is disposed outside of an array that includes the data cell.

17. The sense amplifier of claim 11 wherein the first voltage divider applies a voltage to the reference voltage line.

18. The sense amplifier of claim 11 further comprising a capacitor coupled to the comparator to hold a reference voltage level of the comparator during sensing.

19. A sense amplifier comprising:

a comparator including a first input coupled to a reference voltage node, a second input coupled to a data voltage node, and an output providing a signal indicative of a difference in voltages on the reference and data voltage nodes;

a first load circuit coupled to the reference voltage node to load a reference cell;

a second load circuit coupled to the data voltage node to load a data cell;

an impedance circuit coupled to the first input, the impedance circuit comprising:

a switch coupled to a supply voltage node; and a voltage divider coupled between the switch and ground, the voltage divider including:

a first resistor including a first terminal coupled to the switch and including a second terminal coupled to the first input of the comparator; and a second resistor including a first terminal coupled to the second terminal of the first resistor and including a second terminal coupled to a ground node; and a filter circuit that applies a filtered bias voltage to the switch; and a holding circuit including a capacitor coupled between the first input of the comparator and a ground node, the holding circuit configured to maintain the voltage on the first input of the comparator.

20. The sense amplifier of claim 19 wherein the first load circuit is disposed adjacent said reference cell, the second load circuit is disposed adjacent said data cell.

21. The sense amplifier of claim 20 wherein the reference cell is disposed outside of an array that includes the data cell.

22. The sense amplifier of claim 19 further comprising a first switch coupled between the first and second inputs of the comparator to selectively couple said first and second inputs.

23. The sense amplifier of claim 19 wherein the MOS transistor is an NMOS transistor.

24. The sense amplifier of claim 19 wherein the switch is a MOS transistor and the filter is coupled between the reference supply voltage node and the gate of the MOS transistor.

25. The sense amplifier of claim 23 wherein the NMOS transistor has a gate threshold of about −0.1 to about 0.3 volts.

26. The sense amplifier of claim 23 wherein the NMOS transistor is a native NMOS transistor.

27. The sense amplifier of claim 26 wherein the native NMOS transistor has a gate threshold of about −0.1 to about 0.3 volts.

28. The sense amplifier of claim 23 wherein the NMOS transistor is configured to isolate noise of a supply voltage from the reference voltage line.

29. The sense amplifier of claim 23 wherein the filter circuit is coupled between a reference voltage and the impedance circuit.

30. The sense amplifier of claim 29 wherein the filter circuit generates a filtered bias voltage applied to a gate of the NMOS transistor.

31. The sense amplifier of claim 29 wherein the filter circuit comprises a resistor coupled between the reference voltage and an output connected to the impedance circuit and a capacitor coupled between the output and ground.

32. The sense amplifier of claim 19 wherein the voltage divider applies a voltage to the reference voltage line.

33. The sense amplifier of claim 26 further comprising a switch coupled between the first and second inputs of the comparator to selectively couple said first and second inputs.

* * * * *